(12) United States Patent
Lewis et al.

(10) Patent No.: US 10,409,505 B2
(45) Date of Patent: Sep. 10, 2019

(54) ULTRA-DEEP POWER DOWN MODE CONTROL IN A MEMORY DEVICE

(71) Applicant: Adesto Technologies Corporation, Santa Clara, CA (US)

(72) Inventors: Derric Lewis, Sunnyvale, CA (US); John Dinh, Dublin, CA (US); Gideon Intrater, Sunnyvale, CA (US); Nathan Gonzales, San Jose, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 15/576,941

(22) PCT Filed: Apr. 13, 2016

(86) PCT No.: PCT/US2016/027206
§ 371 (c)(1),
(2) Date: Nov. 27, 2017

(87) PCT Pub. No.: WO2016/204851
PCT Pub. Date: Dec. 22, 2016

(65) Prior Publication Data
US 2018/0150252 A1    May 31, 2018

Related U.S. Application Data

(60) Provisional application No. 62/181,889, filed on Jun. 19, 2015.

(51) Int. Cl.
*G06F 3/06* (2006.01)
*G06F 1/24* (2006.01)
*G06F 1/3234* (2019.01)
*G06F 1/3287* (2019.01)
*G06F 1/3296* (2019.01)
(Continued)

(52) U.S. Cl.
CPC ............ *G06F 3/0625* (2013.01); *G06F 1/24* (2013.01); *G06F 1/3275* (2013.01); *G06F 1/3287* (2013.01); *G06F 1/3296* (2013.01); *G06F 3/068* (2013.01); *G06F 3/0634* (2013.01); *G06F 3/0659* (2013.01); *G06F 13/4282* (2013.01); *G11C 5/148* (2013.01);
(Continued)

(58) Field of Classification Search
None
See application file for complete search history.

(56) References Cited

U.S. PATENT DOCUMENTS

| 5,197,034 A | 3/1993 | Fandrich et al. |
| 6,065,121 A * | 5/2000 | Hobson .............. G06F 1/3203 713/300 |

(Continued)

*Primary Examiner* — Michael Alsip
(74) *Attorney, Agent, or Firm* — Michael C. Stephens, Jr.

(57) ABSTRACT

A method of controlling an ultra-deep power down (UDPD) mode in a memory device, can include: receiving a write command from a host via an interface; beginning a write operation on the memory device to execute the write command; reading an auto-UDPD (AUDPD) configuration bit from a status register; completing the write operation on the memory device; automatically entering the UDPD mode upon completion of the write operation in response to the AUDPD configuration bit being set; and entering a standby mode upon completion of the write operation in response to the AUDPD configuration bit being cleared.

20 Claims, 8 Drawing Sheets

(51) Int. Cl.
  *G06F 13/42* (2006.01)
  *G11C 5/14* (2006.01)
  *G11C 11/417* (2006.01)
(52) U.S. Cl.
  CPC .... *G06F 2213/0016* (2013.01); *G11C 11/417* (2013.01); *Y02D 10/14* (2018.01); *Y02D 10/151* (2018.01)

(56) References Cited

U.S. PATENT DOCUMENTS

| | | |
|---|---|---|
| 9,037,890 B2 | 5/2015 | De Caro et al. |
| 2001/0029566 A1 | 10/2001 | Shin |
| 2002/0191467 A1 | 12/2002 | Matsumoto et al. |
| 2002/0191472 A1 | 12/2002 | Okamoto et al. |
| 2004/0001386 A1* | 1/2004 | Park ................ G11C 5/147 365/227 |
| 2006/0146636 A1* | 7/2006 | Hsu ................. G11C 5/147 365/227 |
| 2007/0147159 A1 | 6/2007 | Lee |
| 2013/0148447 A1 | 6/2013 | Shaeffer et al. |
| 2013/0222009 A1 | 8/2013 | Kang |
| 2014/0032956 A1* | 1/2014 | De Caro ........... G06F 1/3275 713/324 |
| 2014/0245048 A1 | 8/2014 | Sato et al. |

\* cited by examiner

ULTRA-DEEP POWER DOWN MODE CONTROL IN A MEMORY DEVICE

RELATED APPLICATIONS

This application claims the benefit of U.S. Provisional Application No. 62/181,889, filed Jun. 19, 2015, and is the National Stage of International Application No. PCT/US16/27206, filed Apr. 13, 2016, both of which are incorporated herein by reference in their entirety.

FIELD OF THE INVENTION

The present invention generally relates to the field of semiconductor devices. More specifically, embodiments of the present invention pertain to memory devices, such as flash memory devices, and including resistive memory devices.

BACKGROUND

Non-volatile memory (NVM) is increasingly found in applications, such as solid-state hard drives, removable digital picture cards, and so on. Flash memory is the predominant NVM technology in use today, while other NVM technologies, such as resistive switching memory technologies that include resistive RAM (ReRAM) and conductive bridging RAM (CBRAM), can also be employed. In any event, power considerations, and reducing power usage, are becoming increasingly important in semiconductor devices. In order to save power when a memory device is not in use, one or more low power or sleep modes may be supported in the memory device.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Particular embodiments may be directed to memory devices, including non-volatile memory (NVM), such as flash memory devices, and/or resistive switching memories (e.g., conductive bridging random-access memory [CBRAM], resistive RAM [ReRAM], etc.). Particular embodiments can include structures and methods of operating flash and/or resistive switching memories that can be written (programmed/erased) between one or more resistance and/or capacitive states. In one example, a CBRAM storage element may be configured such that when a forward or reverse bias greater than a threshold voltage is applied across electrodes of the CBRAM storage element, the electrical properties (e.g., resistance) of the CBRAM storage element can change. In any event, certain embodiments are suitable to any type of memory device, including both volatile and non-volatile types/devices, and that may include resistive switching memory devices.

Figure 1:
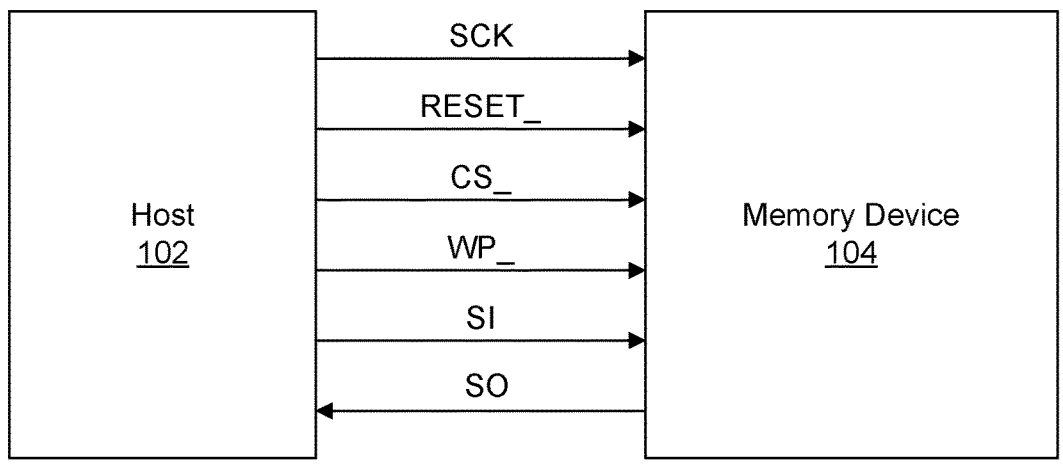
FIG. 1 is a schematic block diagram of an example host and memory device arrangement, in accordance with embodiments of the present invention.

Referring now to FIG. 1, shown is a schematic block diagram 100 of an example host and memory device arrangement, in accordance with embodiments of the present invention. In this example, host 102 can interface with memory device 104 via a serial interface. For example, host 102 can be any suitable controller (e.g., CPU, MCU, general-purpose processor, GPU, DSP, etc.), and memory device 104 can be any type of memory device (e.g., SRAM, DRAM, EEPROM, Flash, CBRAM, magnetic RAM, ReRAM, etc.). Memory device 104 can thus be implemented in a variety of memory technologies, such as non-volatile types. In some cases, memory device 104 can be a serial flash memory that may be implemented in more traditional non-volatile memories, or in CBRAM/ReRAM resistive switching memories.

Various interface signals, such as in a serial peripheral interface (SPI) interface, can be included for communication between host 102 and memory device 104. For example, serial clock (SCK) can provide a clock to device 104, and may be used to control the flow of data to and from the device. Command, address, and input data (e.g., on the SI pin) can be latched on a rising edge of SCK, while output data (e.g., on the SO pin or via I/O pins) can be clocked out on a falling edge of SCK, or by a data strobe in some arrangements. The reset pin (RESET_) can be used to terminate an operation in progress, and to reset an internal state machine of memory device 104 (e.g., to an idle state). Memory device 104 can remain in the reset condition as long as a low level is present on the reset pin. Also, because memory device 104 can include power-on reset circuitry, there may be no restrictions on the reset pin during power-on sequences. In some other implementations, memory device 104 may not include the reset pin (RESET_), and may instead include a hold pin (HOLD_).

Chip select (CS_) can be utilized to select memory device 104, such as from among a plurality of such memory devices, or otherwise as a way to access the device. When the chip select signal is de-asserted (e.g., at a high level), memory device 104 will also be deselected, and may be placed in a standby mode. Activating the chip select signal (e.g., via a high to low transition on CS_) may be utilized to start an operation, and returning the chip select signal to a high state can be utilized for terminating an operation. For internally self-timed operations (e.g., a program or erase cycles), memory device 104 may not enter standby mode until completion of the particular ongoing operation if chip select is de-asserted during the operation.

Write protect (WP_) can be utilized for protection of sectors specified for protection by a register (e.g., the sector protection register). For example, such sectors may be protected against program and erase operations. Thus, if a program or erase command is issued to memory device 104 while the write protect pin is asserted, the device may ignore the command and perform no operation. In the example SPI interface, data can be provided to memory device 104 via a serial input (SI) signal. The serial input can be utilized for data input including command and address sequences. For example, data on the serial input pin can be latched on a rising edge of SCK, and data on the serial input pin can be ignored if the device is deselected (e.g., when the chip select signal is de-asserted). Data can be output from memory device 104 via a serial output (SO) signal. For example, data on the serial output can be clocked out on a falling edge of SCK, and the serial output signal can be in a high impedance state when the device is deselected (e.g., when the chip select signal is de-asserted).

Figure 2:
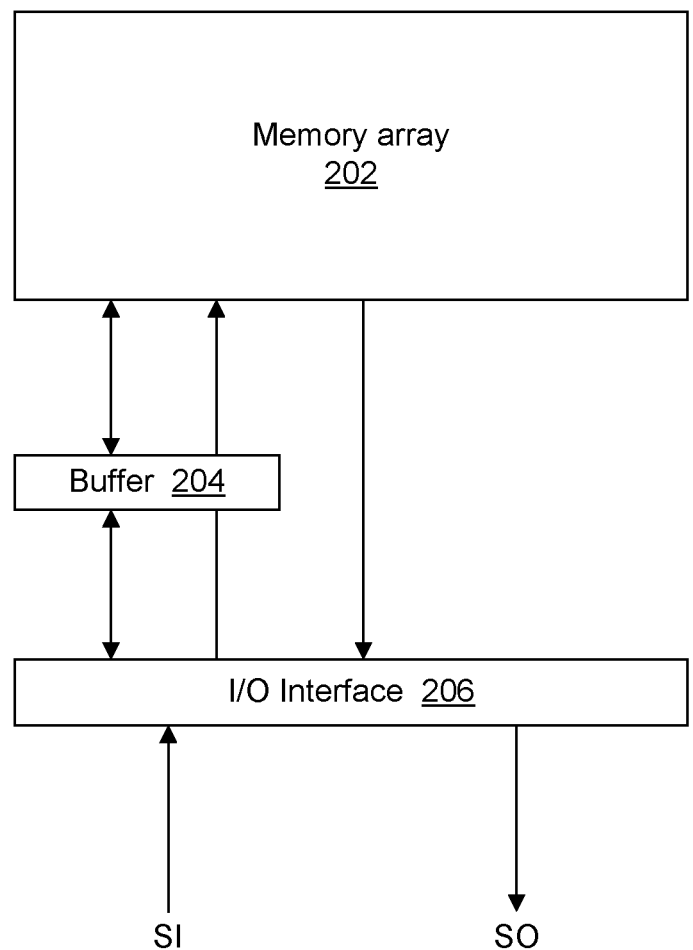
FIG. 2 is a schematic block diagram of an example memory device structure, in accordance with embodiments of the present invention.

Referring now to FIG. 2, shown is a schematic block diagram of an example memory device 104 structure, in accordance with embodiments of the present invention. For example, memory device 104 can include memory array 202, buffer 204 (e.g., SRAM or other fast access memory), and I/O interface 206. In some arrangements, more than one buffer 204 can be provided, such as a buffer for an input path, and another buffer for an output path. Alternatively, or in addition, multiple buffers can be provided for multi-layer buffering. For example, memory device 104 can be configured as a data flash and/or a serial flash device. Memory array 202 can be organized as any suitable number of pages of data. For example, each page can include 256 or 264 bytes of data. Similarly, buffer 204 can store at least a page of data. Also, I/O interface 206 can provide interfacing between memory array 202, buffer 204, and serial data input (SI) and output (SO). For example, I/O interface 206 may be part of an SPI or other serial type of interface.

Figure 3:
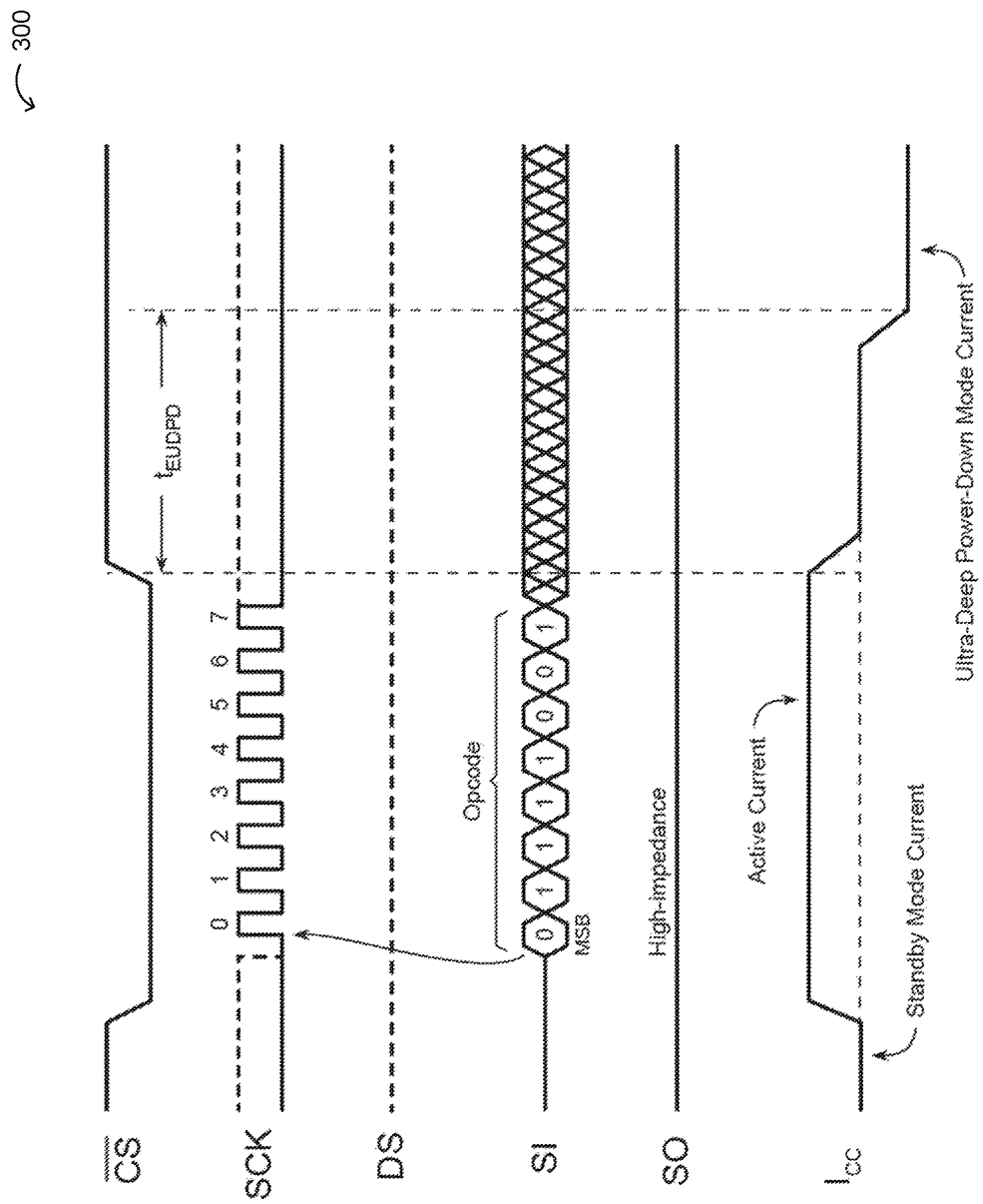
FIG. 3 is a waveform diagram of an example UDPD operation based on an explicit command, in accordance with embodiments of the present invention.

Referring now to FIG. 3, shown is a waveform diagram 300 of an example ultra-deep power down (UDPD) operation based on an explicit command, in accordance with embodiments of the present invention. Current SPI memory (e.g., slave) devices may require the user to issue a specific command (e.g., DP, UDPD) in order to make the memory device enter a low power state. In this case, the host may issue a command including opcode 79h in order to effectively force the memory device into the low power UDPD state. As shown, a supply current ($I_{CC}$) of the memory device when in the UDPD mode may be less than a supply current of the memory device when in the standby mode. Also as shown, the active current, such as when the memory devices in a program or erase operation, can be higher than the supply current of the memory device when in a standby operation. Thus, the UDPD mode or state may effectively be a "sleep" state whereby the memory device is in its lowest power and least active state. Further, other low-power modes, such as deep power down modes may fall between the standby mode and the UDPD mode in terms of supply current.

While the direct command approach is one way to control the memory device to enter the UDPD state, this approach has limits when operating in coordination with a host device, given the characteristics of the UDPD state. For example, in order to issue a UDPD command, the bus master (e.g., host device 102) may need to monitor the status of the memory/slave device (e.g., 104), in order to issue a DP/UDPD command only when the memory device is not busy. The memory device may be considered "busy" or in an active state when the device is, e.g., executing a write (program or erase) operation. In a situation where the bus master (e.g., host 102) is writing data to the slave memory device (e.g., 104), the master may need to wait until the slave has completed the internally timed write task/operation, and then issue the DP/UDPD command. Thus in such cases, only after issuing the UDPD command, can the master/host itself enter into a low power and/or sleep state, in order to maximize power savings for the overall system.

Accordingly, the master device may need to stay awake and not in its own sleep state, which consumes more power, for the duration of the write time of the slave memory device. This can be the case even though the master/host device may have no other tasks to perform in this timeframe, and may instead desire to enter the sleep state as soon as possible as a result. Another potential problem with the UDPD mode is that the memory device may no longer respond back to the commands of the master/host when the memory device is in this UDPD mode. This can make it difficult for the master/host to be sure of whether the memory device is actually in the UDPD mode, in a standby mode, or in some other active state. In one approach, the memory device can be assumed by the host to be in the UDPD mode in such cases, and the host can issue an exit UDPD sequence without knowing for certain of the memory device state. The host can then wait for a predetermined amount of time for the memory device to complete the exit or reset sequence, and to return to the standby state. However, such an approach is wasteful since it can force the memory device to needlessly execute the exit sequence, which can include a full power-on reset (POR) sequence in some cases.

In particular embodiments, an automatic UDPD mode entry can occur upon completion of a write (program or erase) operation, which may allow the memory device to further reduce its energy consumption by automatically entering the UDPD mode at the earliest feasible time. As described herein, the write operation can be any program or erase operation on the memory device, such as including block or chip erase commands, byte/page program commands, or buffer to main memory page program without built-in erase commands, just to name a few. However, strictly buffer write or register write commands may not cause the memory device to go into UDPD mode as described herein. In certain embodiments, the automatic UDPD (AUDPD) mode after program/erase operation can be enabled by setting an AUDPD configuration bit in a status register on the memory device. In addition, the AUDPD configuration bit may be cleared once the memory device goes into the UDPD, such that the AUDPD configuration bit may be set again if another write operation followed by AUDPD mode entry is desired.

Figure 4:
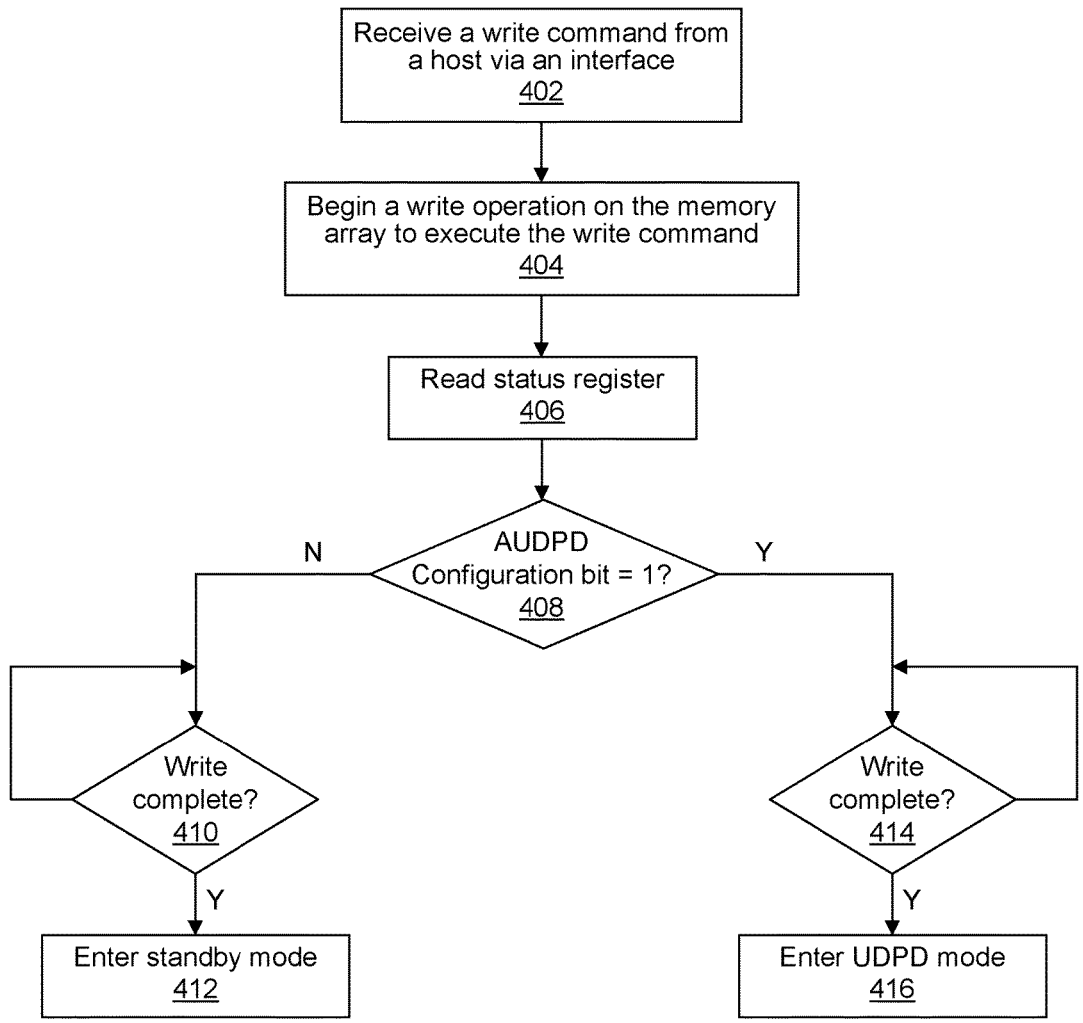
FIG. 4 is a flow diagram of a first example method of controlling a UDPD mode in a memory device, in accordance with embodiments of the present invention.

Referring now to FIG. 4, shown is a flow diagram 400 of a first example method of controlling a UDPD mode in a memory device, in accordance with embodiments of the present invention. At 402, a write command can be received in the memory device from a host via an interface (e.g., SPI). At 404, a write operation can begin on the memory device in order to execute the write command. For example, the write operation can include one or more program and/or erase pulses, such as with a predetermined write algorithm. At 406, a status register on the memory device can be read. In particular, an auto-UDPD (AUDPD) configuration bit state can be determined from the status register.

At 408, if the AUDPD configuration bit is cleared (e.g., state="0"), once the write operation has completed at 410, the device can enter the standby mode at 412. Thus in this case, the memory device may be ready to accept new commands without entering the UDPD state. However, at 408, if the AUDPD configuration bit is set (e.g., state="1"), and once the write operation has completed at 414, the device can automatically enter the UDPD mode. Thus in particular embodiments, the UDPD mode can automatically be entered upon completion of the write operation in response to the AUDPD configuration bit being set on the memory device.

Thus in particular embodiments, a configuration bit, which may be referred to as an AUDPD configuration bit, as designated in the memory device status register, can be utilized to control UDPD mode entry in an automatic fashion. In addition, the user and/or host device may have the ability to set or to clear this AUDPD configuration bit, and this can be done prior to the issuance of any write command to the memory device. In certain embodiments, if the master/host issues a write command with the AUDPD configuration bit on the memory device being in its cleared state (e.g., "0"), the memory device can complete the internally timed write operation, and then may automatically enter the standby state upon completion of the write operation.

However, if the master/host issues a write command with the AUDPD configuration bit in its set state (e.g., "1"), the memory device can complete the write operation, and may then automatically enter into the UDPD mode upon completion of the internally timed write operation. In this way, the master/host can therefore enter its own low power sleep state sooner, and without having to wait for the slave memory device to complete the ongoing write operation. Once the host device issues a write command with the AUDPD configuration bit set, the host device can immediately enter its own sleep state as desired because there is no need to wait for the write operation to complete or to send another command to explicitly put the memory device in the UDPD mode. In one example, if the master device wishes to write a series of pages of data to the memory device, the master/host can initially clear the AUDPD configuration bit, and then may issue the page write commands. Prior to the last page write command being issued, the master/host can set the AUDPD configuration bit, and then issue the last page write command of the series. In this case, the memory device may only enter the UDPD mode in an automatic fashion after the last such page write operation.

In addition, once the memory device enters into the UDPD mode, the master/host device can wake up the slave memory device by using any suitable exit or reset operation, in order to return the memory device to it standby state (e.g., ready to accept new commands). Further, when the master/host device wakes up from its own sleep state and wishes to determine the state of the slave memory device, the host device can issue a read status register (RDSR) command to the memory device to determine the device state. However, in some cases, once the memory device enters the UDPD mode, the memory device may not accept any commands from the host other than the exit UDPD operation command, in order to maximize the power savings during this low power sleep state. As will be discussed in more detail below, particular embodiments also provide an approach that allows the memory device to convey to the host device that it is in the UDPD state.

Figure 5:
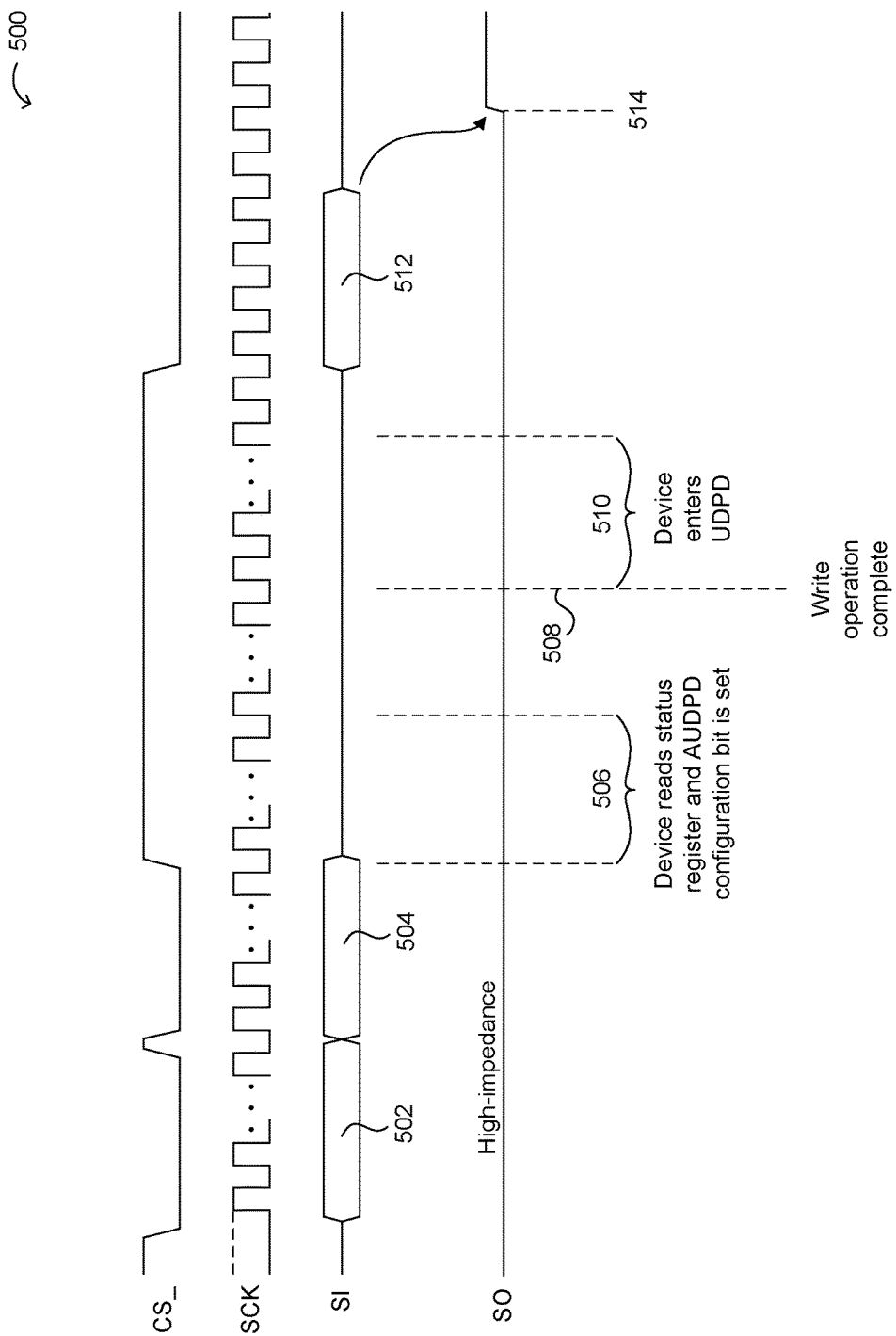
FIG. 5 is a waveform diagram of an example UDPD operation based on automatic entry, in accordance with embodiments of the present invention.

Referring now to FIG. 5, shown is a waveform diagram 500 of an example UDPD operation based on automatic entry, in accordance with embodiments of the present invention. In the example 500, a write command can be issued at 502 and 504, and may include an opcode that indicates the particular type of write operation (e.g., program, erase, etc.), page write operations, and/or data to be written. The memory device can determine the state of the AUDPD configuration bit by reading the status register during 506, which can be during the write operation to execute the write command. If the AUDPD configuration bit is cleared, the memory device can return to a standby state upon completing the write operation at 508. However, if the AUDPD configuration bit is set, the memory device can automatically enter (e.g., without an explicit command from the host) the UDPD mode during 510, upon completion of the internally timed write operation at 508.

In particular embodiments, a UDPD indicator bit, which may be a previously unimplemented or otherwise unallocated bit (e.g., "bit4") in the status register, may typically be read as "0" when the device is in active state (e.g., non-UDPD mode). If the master/host reads the status register from the memory device while the memory device is in the UDPD mode, the memory device may drive a logic "1" on its output pin corresponding to this status register UDPD indicator bit. For example, a status register read command can be issued at 512, while the memory device is in the UDPD mode, and a logic "1" may be driven on the output (e.g., SO) at 514. In some cases, this high level output at 514 may be directly from the state of the UDPD indicator bit as accessed from the status register. In other cases, the memory device may drive the output to a high level when a status register read occurs while the memory device is in the UDPD mode, regardless of the actual state of the UDPD indicator bit in the status register. Thus in this case, this operation may result in the UDPD indicator bit being read as a "1", rather than the "0" that may actually be stored in the status register. In any event, the high value on the output at 514 can be used by the master/host as an indication that the slave memory device is no longer active, but has instead entered into the UDPD mode.

Figure 6:
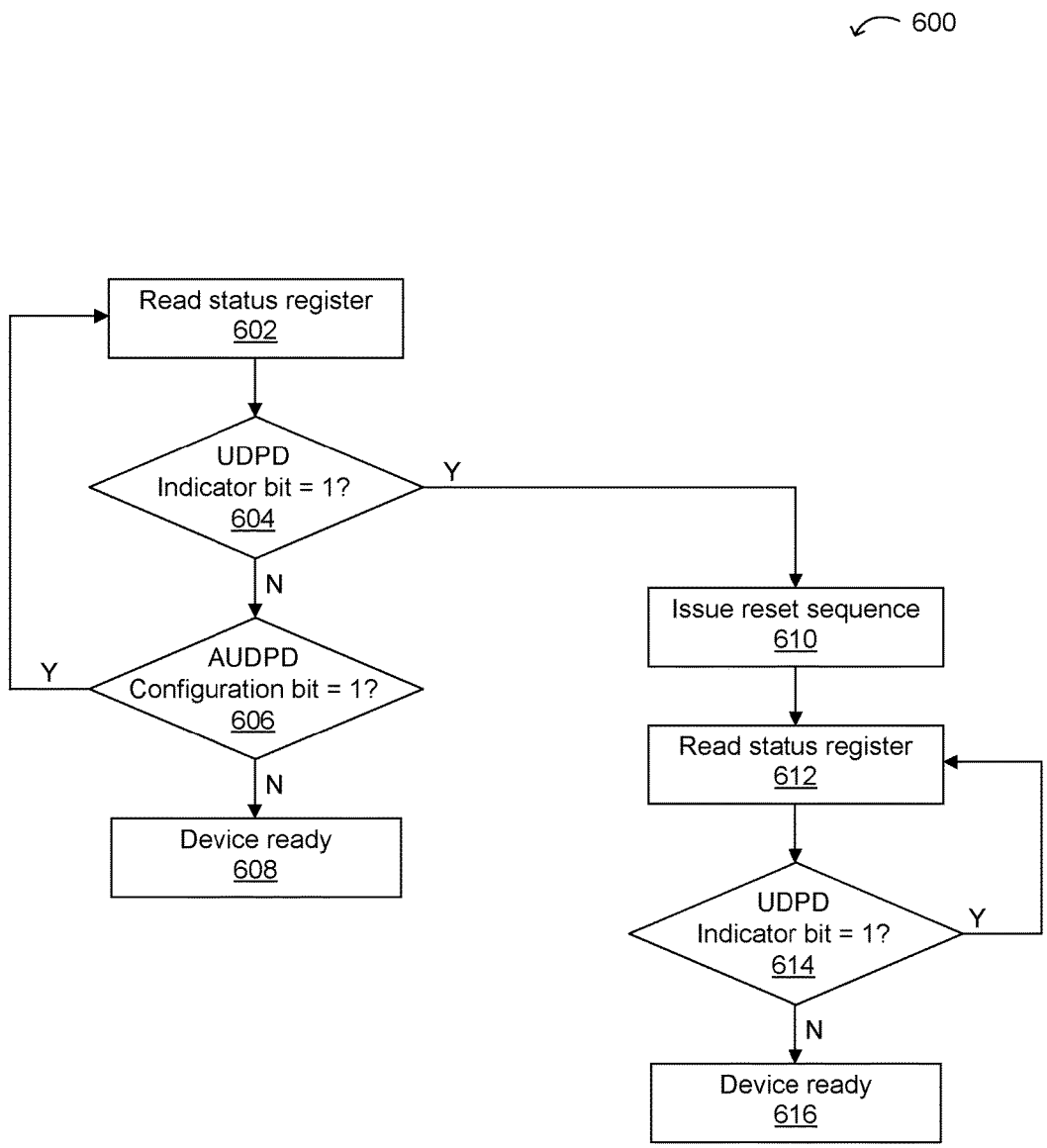
FIG. 6 is a flow diagram of a second example method of controlling a UDPD mode in a memory device, in accordance with embodiments of the present invention.

Referring now to FIG. 6, shown is a flow diagram 600 of a second example method of controlling a UDPD mode in a memory device, in accordance with embodiments of the present invention. At 602, the status register on the memory device can be read, e.g., by host device 102. If at 604, the UDPD indicator bit is read as a "0" then the memory device can be indicated as being in a non-UDPD mode, such as an active state or a standby state. If at 606, the AUDPD configuration bit is determined as set, then the memory device may enter the UDPD mode upon completion of a write operation. However, if at 606, the AUDPD configuration bit is cleared, the device can be in a standby state, may be ready (e.g., to accept a command), and/or may be in an active or non-UDPD mode at 608.

If at 604, the UDPD indicator bit is read as a "1" (see, e.g., 514 in FIG. 5) then the memory device can be indicated as being in the UDPD mode. The memory device can remain in this UDPD mode until a reset sequence, or other appropriate UDPD mode exit operation, is issued by the host device at 610 in order to have the memory device exit from the UDPD mode. At 612, the status register on the memory device can be read by the host device. If at 614, the UDPD indicator bit is read as a "0" then the memory device can be indicated as in a non-UDPD mode, such as an active state, or a standby state, ready (e.g., to accept a command), and/or may be in an active or non-UDPD mode at 616.

Figure 7:
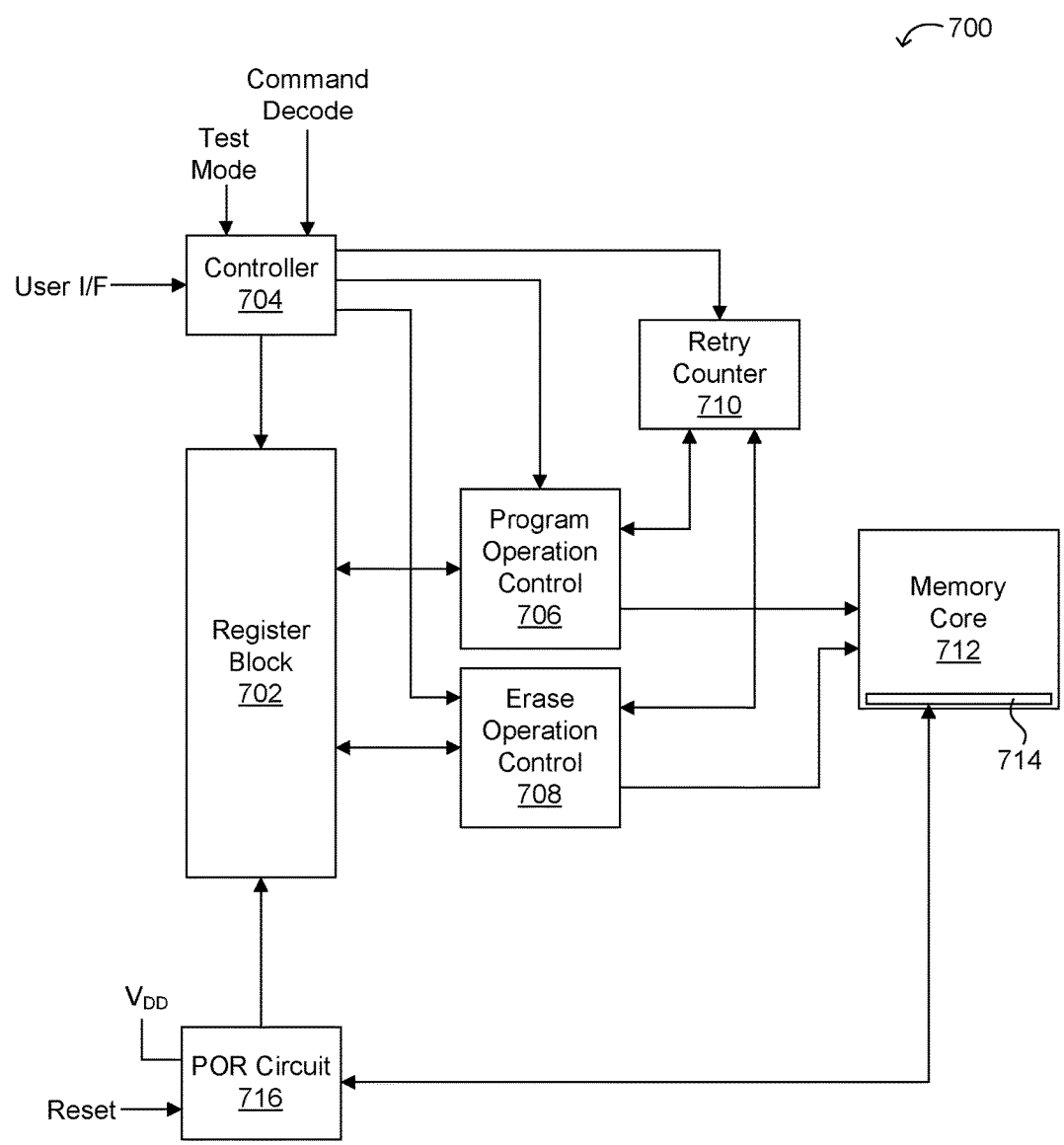
FIG. 7 is a schematic block diagram of an example register and operation control, in accordance with embodiments of the present invention.

Referring now to FIG. 7, shown is a schematic block diagram 700 of an example register and operation control, in accordance with embodiments of the present invention. For example, register block 702 can be implemented using SRAM. Register block 702 can provide algorithm and option variable selections to program operation control 706 and erase operation control 708. For example, register block 702 can also include the status register with an AUDPD configuration bit to indicate that the memory device is to enter the UDPD mode once the present write operation has completed. Also for example, the status register in register block 702 can include the UDPD indicator bit described above whereby a logic state is driven on an output pin to indicate whether the memory device is in the UDPD mode. Controller 704 may determine and decode the received command, and can also control access to the register bits in register block 702. In addition, test modes (e.g., to determine operation distribution, etc.) can be used to override data in register block 702. Settings for register block 702 may be based on various default algorithm and option variable or condition settings, but can also be programmed on lot-by-lot or device-by-device basis. Also, values for program operations, erase operations, and option variable or related condition settings, can be independently programmed in register block 702.

POR circuitry or state machine 716, which can receive a reset signal (e.g., via the RESET_pin), and can access designated register data portion 714 and read out data from that dedicated section of memory array 712. For example, the reset sequence for exiting the UDPD mode can include activating the reset signal. Designated register data portion 714 may alternatively be located outside of memory core 712. In any event, this accessed data that is associated with memory core 712 may then be loaded into register block 702. In this way, information specific to this device can be programmed into the memory core, and whenever the device is powered on (e.g., as detected by $V_{DD}$ supply) or otherwise reset, this data can be loaded into register 702. This is because the memory core, including designated register data portion 714 may include non-volatile memory. Also, different applications-based information can be stored in non-volatile memory designated register data portion 714. Further, different parts or memory cores 712 can be independently programmed (e.g., for different applications, etc.). In some cases, this dedicated portion of memory may not be accessible to the user. However, some applications may allow access to these designated locations, such as in a test mode.

In addition, registers 702 (e.g., including the AUDPD configuration bit) may be programmable by controller 704 and/or by a user via a separate or combined user interface. In this way, a user may be able to program data into registers 702 in order to override or change previous values therein. Particular embodiments may also support independently controlled program/erase algorithm selection for different memory cores 712. For example, controller 704 can set the register values in 702 different for different memory cores 712. For example, register block 702 may include dedicated sectors (e.g., a widened register or increased register bit length) for each memory core, or register block 702 may be replicated for each memory core 712. This may be utilized whereby one memory array 712 is dedicated to one application (e.g., code), while another memory array 712 may be dedicated to another application (e.g., data). In this way, register block 702 may accommodate independently programmable operation algorithms in support of different operations for different memory cores 712. Further, the dedicated sectors in this case can each have their own status register with a corresponding ready bit to indicate if that sector of the memory device is busy with an operation, or in a power down state.

Various program/erase operation algorithms, as well as status, information can be stored in register block 702. For example, at least two bits can be used to indicate which of a predefined group of program algorithms is to be used to execute a program command. Similarly, at least two bits in register block 702 can be used to indicate which of a predefined group of erase algorithms is to be used to execute an erase command. Further, option variables that define conditions (e.g., pulse widths, voltage levels, current levels, etc.) for the program and erase operations of the selected operation algorithm may also be defined in register block 702. In addition, a maximum number of retry attempts, which may be embedded within one or more of the program/ erase algorithms may also be stored in register block 702. For example, retry counter 710 may keep track of a number of attempts for a given program or erase operation, or a sequence of program and/or erase operations, as part of a selected program/erase operation algorithm.

Particular embodiments may also support dynamically changing the operation algorithm as the semiconductor device ages, or arrays thereof are cycled more and more. For example, counters may be used to move to different algorithm and/or option variable selections and effectively change the program/erase algorithms to be used based on the counter results. In one example, designated register data portion 714 can be updated to reflect changed algorithm selections, option variables, etc., values based on such counter results. As a result, register block 702 can be updated via POR circuit 716, as discussed above. In another example, incremented values based on the counter results can be dynamically determined based on data output from register block 702. In this case, data that is read from register block 702 can then be updated by subsequent circuitry based on the counter results, before being provided as outputs to program operation control 706 and erase operation control 708. In any event, program operation control 706 and erase operation control 708 can be used in coordination with other control circuitry to complete an ongoing write operation and then enter the UDPD mode in response to the AUDPD configuration bit being set.

Figure 8:
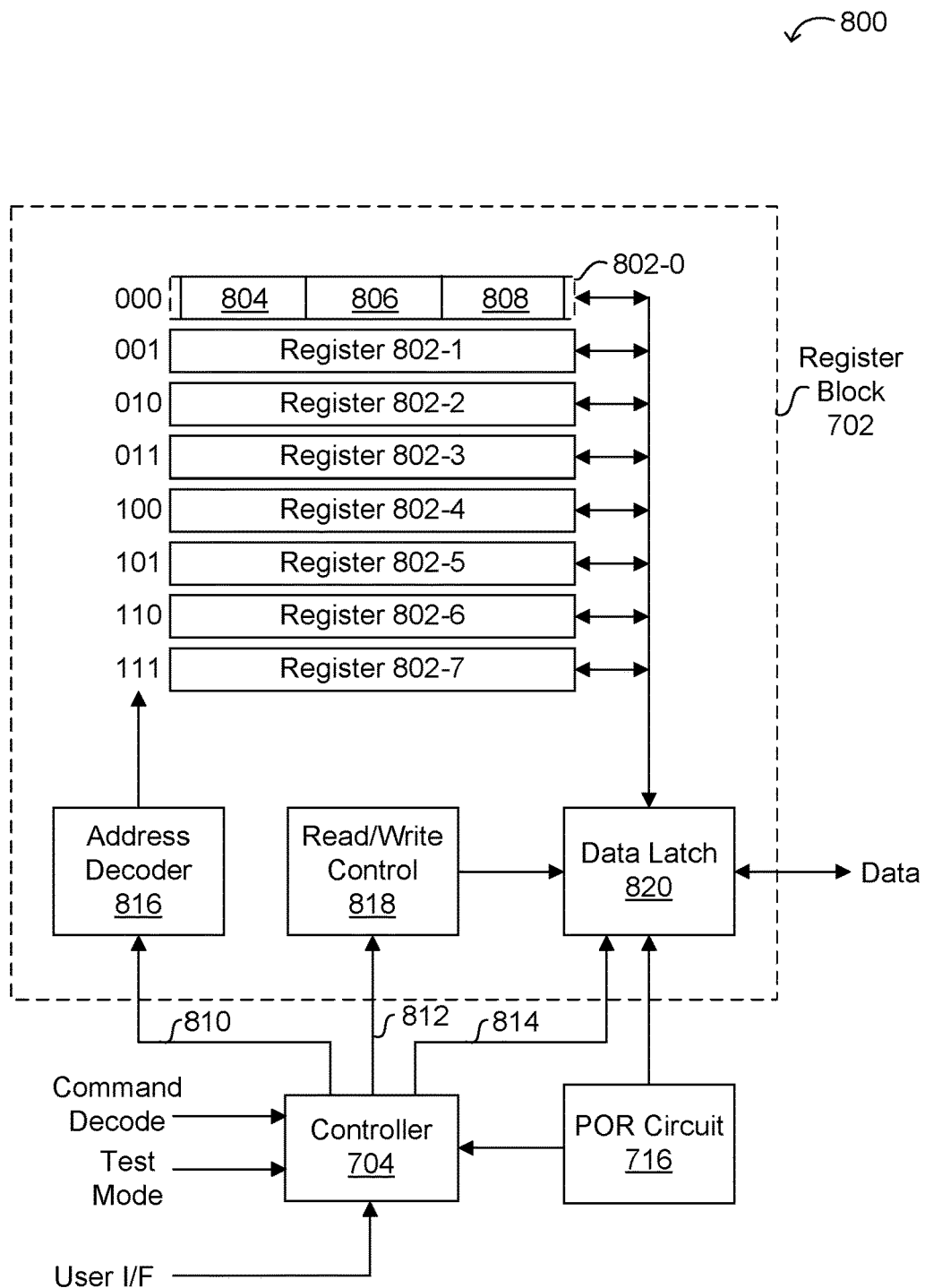
FIG. 8 is a schematic block diagram of an example register structure, in accordance with embodiments of the present invention.

Referring now to FIG. 8, shown is a schematic block diagram 800 of an example register structure, in accordance with embodiments of the present invention. In this example, register block 702 can include eight registers 802 (e.g., 802-0, 802-1, . . . 802-7). Each register 802 can include a number of fields. For example, field 804 may be a 2-bit wide field to store data representing erase operation algorithms. Also for example, field 806 may be a 2-bit wide field to store data representing program operation algorithms. Also for example, field 808 may be a 2-bit wide field to store data representing retry loops. Other fields (not shown) may be used to indicate option variables to set conditions for the various algorithms. Various fields of registers 802 may generally be used to form or support a conditions table that may be accessed (e.g., by program operation control 706, erase operation control 708, etc.) to set the conditions for one or more of the program and erase operations of a selected operation algorithm. Also, one or more of registers 802 can be configured as a status register including an AUDPD configuration bit to indicate that the memory device is to enter the UDPD mode once the present operation has completed, as well as a UDPD indicator bit described above whereby a logic state can be driven on an output pin to indicate whether the memory device is in the UDPD mode.

Register block 702 can also include address decoder 816, which can receive signals 810 (e.g., address, address load, etc.) from controller 704, and may provide 3-bit decoded values to address one of eight registers 802. Read/write control 818 can receive signals 812 (e.g., read control signal, write control signal, etc.) from controller 704, and may provide a control signal to data latch 820. Data latch 820 can receive signals 814 (e.g., read data strobe, data out enable, load data, etc.) from controller 704, and may receive or provide the data to/from register block 702. Also, while only eight registers are shown in the particular example of FIG. 8, any suitable number of registers can be accommodated in particular embodiments. For example, 24 registers can be included, where each register is 8-bits wide. In addition, such registers may support other programmable impedance device-based functions, such as word line voltage level, compliance current (e.g., where the cell is programmed until reaching this compliance current, X µA), equalization pulse width, single ended or differential sense amplifier configuration, other status information, as well as any number of other device functions and/or parameters.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of controlling an ultra-deep power down (UDPD) mode in a memory device, the method comprising:
   a) receiving a write command from a host via an interface;
   b) beginning a write operation on the memory device to execute the write command;
   c) reading an auto-UDPD (AUDPD) configuration bit from a status register during the write operation;
   d) completing the write operation on the memory device;
   e) automatically entering the UDPD mode upon completion of the write operation in response to the AUDPD configuration bit being set;
   f) driving a low impedance output from the memory device in response to a read status register command being received from the host while the memory device is in the UPDP mode; and
   g) entering a standby mode upon completion of the write operation in response to the AUDPD configuration bit being cleared.

2. The method of claim 1, wherein the low impedance output from the memory device is configured to indicate to the host that the memory device is in the UDPD mode by transition from a high impedance state.

3. The method of claim 1, wherein the memory device drives the low impedance output regardless of a UDPD indicator bit state in the status register.

4. The method of claim 1, further comprising exiting the UDPD mode in response to receiving a reset sequence from the host.

5. The method of claim 1, wherein the host is configured to enter a sleep state upon issuing the write command to the memory device with the AUDPD configuration bit being set in the memory device.

6. The method of claim 1, further comprising:
   a) clearing, by the memory device, the AUDPD configuration bit after automatically entering the UDPD mode; and
   b) setting, by a command from the host, the AUDPD configuration bit prior to a new write command when the UDPD mode is to automatically be entered following the new write command.

7. The method of claim 1, further comprising:
   a) receiving a command from the host to clear the AUDPD configuration bit;
   b) receiving a plurality of page write commands from the host; and
   c) receiving, prior to executing a last of the plurality of page write commands, a command from the host to set the AUDPD configuration bit.

8. The method of claim 1, wherein a supply current of the memory device when in the UDPD mode is less than a supply current of the memory device when in the standby mode.

9. A memory device, comprising:
   a) a command decoder configured to detect a write operation that is to be executed on the memory device in response to a write command issued by a host via an interface;
   b) a write controller configured to execute the write operation;
   c) a status register having an auto ultra-deep power down (AUDPD) configuration bit;

d) a controller configured to automatically enter a UDPD mode upon completion of the write operation in response to the AUDPD configuration bit being set;

e) an output circuit configured to drive a low impedance output from the memory device in response to a read status register command being received from the host while the memory device is in the UPDP mode; and f) the controller being configured to enter a standby mode upon completion of the write operation in response to the AUDPD configuration bit being cleared.

10. The memory device of claim 9, wherein the low impedance output from the memory device is configured to indicate to the host that the memory device is in the UDPD mode by transition from a high impedance state.

11. The memory device of claim 9, wherein the memory device is configured to drive the low impedance output regardless of a UDPD indicator bit state in the status register.

12. The memory device of claim 9, being configured to exit the UDPD mode in response to receiving a reset sequence from the host.

13. The memory device of claim 9, wherein the host is configured to enter a sleep state upon issuing the write command to the memory device with the AUDPD configuration bit being set in the memory device.

14. The memory device of claim 9, wherein the AUDPD configuration bit is configured to be:

a) cleared by the memory device after automatically entering the UDPD mode; and b) set, by a command from the host, prior to a new write command when the UDPD mode is to automatically be entered following the new write command.

15. The memory device of claim 9, wherein the interface comprises a serial peripheral interface (SPI).

16. The memory device of claim 9, wherein a supply current of the memory device when in the UDPD mode is less than a supply current of the memory device when in the standby mode.

17. A method of controlling an ultra-deep power down (UDPD) mode in a memory device, the method comprising:

a) reading a UDPD indicator bit from a status register on the memory device;

b) reading an auto-UDPD (AUDPD) configuration bit from the status register;

c) determining that the memory device is in a standby mode when the UDPD indicator bit and the AUDPD configuration bit are both cleared;

d) receiving a low impedance output from the memory device in response to reading the status register while the memory device is in the UPDP mode;

e) issuing a reset sequence to the memory device in order to exit from the UDPD mode in response to the UDPD indicator bit being set as indicated by the low impedance output from the memory device; and f) reading the status register in response to the UDPD indicator bit being cleared and the AUDPD configuration bit being set.

18. The method of claim 17, wherein the low impedance output from the memory device is configured to indicate that the memory device is in the UDPD mode by transition from a high impedance state.

19. The method of claim 17, further comprising:

a) reading, after issuing the reset sequence, the UDPD indicator bit; and b) determining that the memory device is in the standby mode when the UDPD indicator bit is cleared.

20. The method of claim 19, further comprising reading the status register in response to the UDPD indicator bit being set.

* * * * *